United States Patent
An

(10) Patent No.: US 7,441,156 B2
(45) Date of Patent: Oct. 21, 2008

(54) SEMICONDUCTOR MEMORY DEVICE HAVING ADVANCED TEST MODE

(75) Inventor: Yong-Bok An, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/005,539

(22) Filed: Dec. 26, 2007

(65) Prior Publication Data

US 2008/0106959 A1 May 8, 2008

Related U.S. Application Data

(63) Continuation of application No. 10/882,740, filed on Jun. 30, 2004, now Pat. No. 7,321,991.

(30) Foreign Application Priority Data

| Jan. 10, 2004 | (KR) | ............... 10-2004-01824 |
| Mar. 19, 2004 | (KR) | ............... 10-2004-18919 |

(51) Int. Cl.
  *G06F 11/00* (2006.01)
(52) U.S. Cl. ........................................... 714/42
(58) Field of Classification Search ............ 714/42, 714/25, 27, 30–32, 718
  See application file for complete search history.

(56) References Cited

U.S. PATENT DOCUMENTS

| 5,506,849 | A | * | 4/1996 | Kato | ............. 714/719 |
| 5,587,950 | A | * | 12/1996 | Sawada et al. | ............. 365/201 |
| 5,864,510 | A | * | 1/1999 | Nakaoka | ............. 365/201 |
| 5,959,930 | A | * | 9/1999 | Sakurai | ............. 365/230.03 |
| 6,115,833 | A | * | 9/2000 | Sato et al. | ............. 714/718 |
| 6,163,863 | A | * | 12/2000 | Schicht | ............. 714/718 |
| 6,529,429 | B2 | * | 3/2003 | Cowles et al. | ............. 365/201 |
| 6,721,230 | B2 | * | 4/2004 | Weitz | ............. 365/230.03 |
| 7,321,991 | B2 | * | 1/2008 | An | ............. 714/42 |
| 2003/0099142 | A1 | * | 5/2003 | Cowles et al. | ............. 365/200 |
| 2003/0142577 | A1 | * | 7/2003 | Kumazaki et al. | ....... 365/230.06 |

* cited by examiner

*Primary Examiner*—Nadeem Iqbal
(74) *Attorney, Agent, or Firm*—Blakely, Sokoloff, Taylor & Zafman

(57) ABSTRACT

An apparatus for testing an operation of a semiconductor memory device having a plurality of banks in a compress test mode includes an internal address generator for receiving an external bank address and generating internal bank addresses in response to a bank interleaving test signal; a read operation testing block for receiving the internal bank addresses and testing a read operation of the semiconductor memory device in response to the bank interleaving test signal; and a write operation testing block for receiving the internal bank addresses and testing a write operation of the semiconductor memory device.

8 Claims, 7 Drawing Sheets

SEMICONDUCTOR MEMORY DEVICE HAVING ADVANCED TEST MODE

The present patent application is a continuation of application Ser. No. 10/882,740, filed Jun. 30, 2004 now U.S. Pat. No. 7,321,991.

FIELD OF INVENTION

The present invention relates to a semiconductor memory device; and, more particularly, to a semiconductor memory device having enhance ability of a test for finding fault of an operation of a semiconductor memory device in a bank interleaving mode.

DESCRIPTION OF PRIOR ART

A semiconductor memory device includes a plurality of memory cells. If any cell in the semiconductor memory device is operated out of order, the semiconductor memory device is useless. After the semiconductor memory device is fabricated, there is needed a test process for finding a defective cell in the semiconductor memory device.

Typically, the semiconductor memory device has an additional area for a test circuit which can test all cells in the semiconductor memory device on high speed. However, according to increasing integration of the semiconductor memory device, there is needed a lot of time and effort for testing cells of the semiconductor memory device so as to research and develop the semiconductor memory device.

Thus, for saving the time to test the semiconductor memory device, a compress test mode is used. In the compress test mode, data is simultaneously inputted to all banks included in the semiconductor throughout a part of input/output pins DQs, not all of input/output pins. For checking data outputted from each unit cell, each inputted data is not simultaneously outputted from all banks throughout all of input/output pins DQs and, as a substitute, a plurality of logic gates, e.g., a AND gate or a NOR gate, each for corresponding to each input/output pin DQ, are used.

FIG. 1 is a block diagram showing a test block used in a conventional semiconductor memory device.

As shown, the test block includes an internal bank address generator 10, a read decoding block 20, a compress controlling block 30, a data compress block 40, a write decoding block 50, a write controlling block 60 and a writing driving block 70.

The internal bank address generator 10 converts a bank address, e.g., BA0 and BA1, into a plurality of internal bank addresses, i.e., a, /a, b, /b, c, /c, d, /d. The plurality of internal bank addresses, i.e., a, /a, b, /b, c, /c, d, /d, are inputted to the read decoding block 20. The read decoding block 20 decodes the plurality of internal bank addresses, i.e., a, /a, b, /b, c, /c, d, /d, to thereby generate a plurality of read bank operating signals rd_bank0, rd_bank1, rd_bank2 and rd_bank3 in response to an additive latency signal AL0. The compress controlling block 30 is for controlling the data compress block 40 in response to the plurality of read bank operating signals rd_bank0, rd_bank1, rd_bank2 and rd_bank3. The data compress block 40 having a plurality of DQ output buffers, e.g., 36, is for compressing data outputted from each bank.

In addition, parts of the plurality of internal bank addresses, i.e., a, /a, b, /b, are inputted to the write decoding block 50. The write decoding block 50 decodes the parts of plurality of internal bank addresses, i.e., a, /a, b, /b, to thereby generate a plurality of write bank operating signals wt_bank0, wt_bank1, wt_bank2 and wt_bank3. The write controlling block 60 is for controlling the write driving block 70 in response to a write activation signal WTen and the plurality of write bank operating signals wt_bank0, wt_bank1, wt_bank2 and wt_bank3. The write driving block 70 is for storing inputted data to a cell arrays 80 included in each bank.

Furthermore, the internal bank address generator 10 includes a buffer block, a latch block and a routing block. The buffer block includes two buffers, e.g., 12, each for receiving a first bit bank address BA0 and a second bit bank address BA1 and converting the first bit bank address BA0 and the second bit bank address BA1 into an internal bank address, i.e., ba0_add, ba0_addb, ba1_add and ba1_addb, each corresponding to the first bit bank address BA0 and the second bit bank address BA1. The latch block includes two latches, e.g., 14, each controlled by a compress test signal tpara for transmitting the internal bank address, i.e., ba0_add, ba0_addb, ba1_add and ba1_addb, to the routing block as the parts of the plurality of internal bank addresses, i.e., a, /a, b, /b. The routing block also includes two routers, e.g., 16, each for delaying the parts of the plurality of internal bank addresses, i.e., a, /a, b, /b, to thereby generate others of the plurality of internal bank addresses, i.e., c, /c, d, /d.

In detail, the compress controlling block 30 includes a read controlling block 32 and a strobe signal generating block 34. The read controlling block 32 includes a plurality of read controllers, each controlled by a read activation signal RDen for receiving the read bank operating signal; and the strobe signal generating block 34 includes a plurality of strobe signal generators, each for generating a plurality of strobe signals, e.g., iostb.

Herein, each read controller, each strobe signal generator and each DQ output buffer are respectively corresponded to each bank included in the conventional semiconductor memory device. In addition, each buffer, each latch and each router in the internal bank address generator 10 are respectively corresponded to each bit of the bank address.

Hereinafter, there is described a test operation of the conventional semiconductor memory device when the compress test signal tpara is activated.

First, the internal bank address generator 10 activates the plurality of internal bank addresses, i.e., a, /a, b, /b, c, /c, d, /d, in response to the compress test signal tpara without a regard of the bank address. Then, the plurality of read bank operating signals rd_bank0, rd_bank1, rd_bank2 and rd_bank3 outputted from the read decoding block 20 and the plurality of write bank operating signals wt_bank0, wt_bank1, wt_bank2 and wt_bank3 outputted from the write decoding block 50 are activated. If the write activation signal WTen is activated, the write controlling block 60 and the writing driving block 70 are activated and, then, data are inputted to the cell arrays 80. Otherwise, if the read activation signal RDen is activated, a plurality of data LI00<0:15> to LI03<0:15> outputted from the cell arrays 80 is compressed and outputted.

Furthermore, an operation of the test block, i.e., methods for decoding compressed data and compressing outputted data, are described in detail.

In the conventional memory device, each bank has one data pad for receiving four data once. The four data is considered as one data bunch; and four data bunches constitute a 16-bit data. At a write operation, the same 16-bit data is inputted to each bank.

At a read operation, the 16-bit data inputted to each bank is classified into four data bunch; and each datum, which is inputted throughout the same data pad, among four data of each data bunch is compared with each other. Then, through the data pad corresponding to each bank, the comparison result is outputted.

Herein, if a logic state of signal outputted throughout the data pad is a logic high level, the semiconductor memory device has no defective cell; but, otherwise, the semiconductor memory device has at least one defective cell.

FIG. 2 is a schematic circuit diagram describing the latch included in the latching block 14 shown in FIG. 1.

As shown, the latch includes a first inverter I1, first latch unit 14a, a second latch unit 14b, a first NAND gate ND1 and a second NAND gate ND2. Herein, the first and second latch units 14a and 14b are constituted with two circularly connected inverters.

The first inverter I1 is for inverting the compress test signal tpara. The first latch unit 14a is for latching an inverse internal bank address, e.g., ba0_addb; and the second latch unit 14b is for latching an internal bank address, e.g., ba0_add. The first NAND gate ND1 coupled to the first latch unit 14a and the first inverter I1 receives an inverse state of the inverse internal bank address, i.e., internal bank address, and an inverse compress test signal to generate a result signal of the NAND operation as a first internal bank address a. Also, the second NAND gate ND2 coupled to the second latch unit 14b and the first inverter I1 receives an inverse state of the internal bank address, i.e., inverse internal bank address, and an inverse compress test signal to generate a result signal of the NAND operation as a first bar internal bank address /a.

FIG. 3 is a schematic circuit diagram describing the router included in the routing block 14 shown in FIG. 1.

As shown, the router includes a latching and delaying block 17, a second inverter I2, a third NAND gate ND3 and a fourth NAND gate ND4.

The latching and delaying block 17 receives the first internal bank address, i.e., a, and the first bar internal bank address, i.e., /a, outputted from the latch to thereby output a delay signal to the third NAND gate. The second inverter I2 is for inverting the compress test signal tpara. The third NAND gate ND3 coupled to the latching and delaying block 17 and the second inverter I2 receives an outputted signal from the latching and delaying block 17 and an inverse compress test signal to generate a result signal of the NAND operation as a third internal bank address c. Also, the second NAND gate ND2 coupled to the first inverter I1 receives the third internal bank address, i.e., c, and an inverse compress test signal to generate a result signal of the NAND operation as a third bar internal bank address /c.

With a reference, each latch and each router respectively have the same structures; and, thus, detailed descriptions of other latches and routers are omitted.

FIG. 4 is a schematic circuit diagram describing the read decoding block 20 shown in FIG. 1.

As shown, the read decoding block 20 includes a control signal generator 21 and a plurality of decoders 22, 24, 26 and 28. The control signal generator 21 is for generating control signals, e.g., AL0b and AL0d, in response to the additive latency signal AL0. Each decoder receives two internal bank addresses and selects one of the two internal bank addresses in response to the control signals, e.g., AL0b and AL0d, to thereby generate an inverse selected address as the read bank operation signal.

In detail, the control signal generator 21 includes a third inverter I3 for inverting the compress test signal tpara, a fifth NAND gate ND5 for generating a result signal of the NAND operation of the additive latency signal AL0 and the inverse compress test signal and a fourth inverter I4 for inverting a first control signal AL0b, i.e., an outputted signal from the fifth NAND gate ND5, to thereby generate a second control signal AL0d.

Each decoder includes two NAND gates, two transfer gates and one inverter. Each of the two NAND gates receives two internal bank addresses and generates a result signal of the NAND operation; each of the two transfer gates transmits the result signal in response to the first and second control signals AL0b and AL0d. Then, the inverter is for converting output signals from the two transfer gates to thereby generate an inverse signal of the output signals as the read bank operating signal.

Referring to FIG. 4, there are four decoders included in the reading decoding block 20. The plurality of internal bank addresses, i.e., a, /a, b, /b, c, /c, d, /d, are classified into four groups, each including four internal bank addresses: (/a, /b, /c, /d), (a, /b, c, /d), (/a, b, /c, d) and (a, b, c, d).

Herein, each decoder, e.g., 22, 24, 26 and 28, decodes one group of non-delay internal bank addresses, i.e., a, /a, b, /b, which are outputted from the latch block, and delay internal bank addresses, i.e., c, /c, d, /d, which are outputted from the routing block in response to the first and second control signals AL0b and AL0d.

In the conventional memory device, it is required a RAS to CAS delay tRCD which is the minimum time from supplying a row activation signal to supplying a column activation signal. However, as an additive latency is introduced for increasing an operation speed of the semiconductor memory device, the column activation signal is supplied before the RAS to CAS delay tRCD after the row activation signal is supplied. That is, according to the additive latency, a timing of supplying the column activation signal can be adjusted.

If the additive latency signal AL0 is inactivated, e.g., the additive latency is 2 or 3, the column activation signal is inputted before the RAS to CAS delay tRCD and, then, there is a lot of time margin for accessing data in response to the column activation signal. In this case, because of a lot of time margin, the delay internal bank addresses, i.e., c, /c, d, /d, which are delayed by the routing block 16 are decoded in the read decoding block 20.

Otherwise, if the additive latency signal AL0 is activated, e.g., the additive latency is 0, the column activation signal is inputted after the RAS to CAS delay tRCD and, then, there is little time margin for accessing data in response to the column activation signal. In this case, because of little time margin, the non-delay internal bank addresses, i.e., a, /a, b, /b, are decoded in the read decoding block 20.

FIG. 5 is a schematic circuit diagram describing the DQ output buffer included in the data compress block 40 shown in FIG. 1.

As shown, the DQ output buffer included in data compress block 40 includes a strobe control generator 42, a comparison block 44 and a strobe driving block 46. Furthermore, there is shown a GIO driver including two MOS transistors PM1 and NM1 serially coupled between a supply voltage and a ground.

The strobe control generator 42 receives the compress test signal tpara and the strobe signal iostb outputted from the strobe signal generator included in signal generating block 34 to thereby generate a first and a second data strobe signals iostb2 and iostb2b. The comparison block 44 receives each of data LI00<0:15> to LI03<0:15> outputted from the cell arrays 80 in order to compress the 16-bit data. Lastly, the strobe driving block 46 outputs a compressed data outputted from the comparison block 44 to the GIO driver in response to the first and the second data strobe signals iostb2 and iostb2b.

As above described, the conventional semiconductor memory device can test all of unit cells so fast by using the compress test mode.

However, the test mode included in the conventional semiconductor memory device cannot test a bank interleaving mode because all banks included in the conventional memory device are simultaneously activated. In fact, the conventional semiconductor memory device operates in the bank interleaving mode in order to increasing an operation speed. In the bank interleaving mode, a data collision or a skew can be occurred when data is randomly read or written between each bank.

Therefore, for testing an operation of the conventional semiconductor memory device in the bank interleaving mode, data cannot be compressed and, as a result, a required time for testing is too long.

SUMMARY OF INVENTION

It is, therefore, an object of the present invention to provide a semiconductor memory device having advanced ability for finding fault of an operation of a semiconductor memory device in a bank interleaving mode in order to reduce a test time.

In accordance with an aspect of the present invention, there is provided a method for testing an operation of a semiconductor memory device having a plurality of banks in a compress test mode including the steps of: (A) testing the semiconductor memory device by simultaneously activating the plurality of banks; and (B) testing the semiconductor memory device by randomly activating the plurality of banks.

In accordance with another aspect of the present invention, there is provided an apparatus for testing an operation of a semiconductor memory device having a plurality of banks in a compress test mode including an internal address generator for receiving an external bank address and generating internal bank addresses in response to a bank interleaving test signal; a read operation testing block for receiving the internal bank addresses and testing a read operation of the semiconductor memory device in response to the bank interleaving test signal; and a write operation testing block for receiving the internal bank addresses and testing a write operation of the semiconductor memory device.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 6:
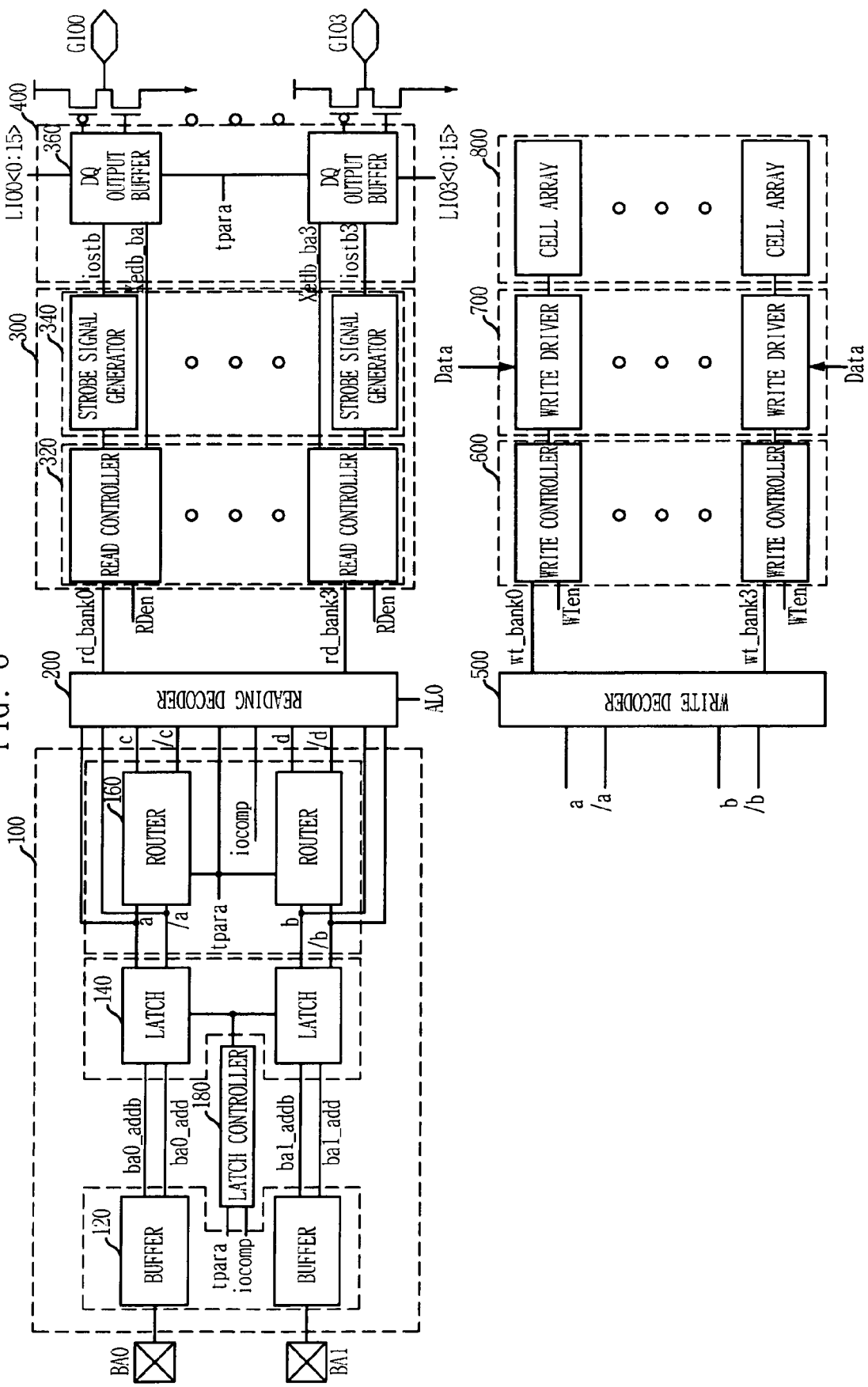
FIG. 6 is a block diagram showing a test block used in a semiconductor memory device in accordance with the present invention.

FIG. 6 is a block diagram showing a test block used in a semiconductor memory device in accordance with the present invention.

As shown, the test block includes an internal address generator 100, a read operation testing block and a write operation testing block.

The internal address generator 100 receives an external bank address, e.g., BA0, and generates internal bank addresses, e.g., a and /a, in response to a bank interleaving test signal iocomp. The read operation testing block is for receiving the internal bank addresses, e.g., a and /a, and testing a read operation of the semiconductor memory device in response to the bank interleaving test signal iocomp. The write operation testing block receives the internal bank addresses, e.g., a and /a, and tests a write operation of the semiconductor memory device.

Herein, the read operation testing block includes a read decoding block 200, a compress controlling block 300 and a data compress block 400; and the write operation testing block includes a write decoding block 500, a write controlling block 600 and a writing driving block 700.

In detail, the internal bank address generator 100 converts a bank address, e.g., BA0 and BA1, into a plurality of internal bank addresses, i.e., a, /a, b, /b, c, /c, d, /d, in response to a compress test signal tpara and the bank interleaving test signal iocomp. Herein, the internal bank addresses, i.e., a, /a, b, /b, c, /c, d, /d, are classified into non-delay internal bank addresses, i.e., a, /a, b, /b, and delay internal bank addresses, i.e., c, /c, d, /d. The plurality of internal bank addresses, i.e., a, /a, b, /b, c, /c, d, /d, are inputted to the read decoding block 200. The read decoding block 200 decodes the plurality of internal bank addresses, i.e., a, /a, b, /b, c, /c, d, /d, to thereby generate a plurality of read bank operating signals rd_bank0, rd_bank1, rd_bank2 and rd_bank3 in response to an additive latency signal AL0 and the bank interleaving test signal iocomp. The compress controlling block 300 is for controlling the data compress block 400 in response to the plurality of read bank operating signals rd_bank0, rd_bank1, rd_bank2 and rd_bank3. The data compress block 400 having a plurality of DQ output buffers is for compressing data outputted from each bank to thereby output a test result signal in response to the compress test signal tpara and a bank inactivation signal, e.g., Xedb_ba.

In addition, the non-delay internal bank addresses, i.e., a, /a, b, /b, are inputted to the write decoding block 500. The write decoding block 500 decodes the parts of plurality of internal bank addresses, i.e., a, /a, b, /b, to thereby generate a plurality of write bank operating signals wt_bank0, wt_bank1, wt_bank2 and wt_bank3. The write controlling block 600 is for controlling the write driving block 700 in response to a write activation signal WTen and the plurality of write bank operating signals wt_bank0, wt_bank1, wt_bank2 and wt_bank3. The write driving block 700 is for storing inputted data to a cell arrays 800 included in each bank.

Furthermore, the internal bank address generator 100 includes a latch controller 180, a buffer block, a latch block and a routing block. The latch controller 180 is for receiving the compress test signal tpara and the bank interleaving test signal iocomp and controlling a latch control signal. The buffer block includes two buffers, e.g., 120, each for receiving a first bit bank address BA0 and a second bit bank address BA1 and converting the first bit bank address BA0 and the second bit bank address BA1 into an internal addresses, i.e., ba0_add, ba0_addb, ba1_add and ba1_addb, each corresponding to the first bit bank address BA0 and the second bit bank address BA1. The latch block includes two latches, e.g., 140, each controlled by the latch control signal for transmitting the internal addresses, i.e., ba0_add, ba0_addb, ba1_add and ba1_addb, to the routing block as the non-delay internal bank addresses, i.e., a, /a, b, /b. The routing block also includes two routers, e.g., 160, each for delaying the parts of the plurality of internal bank addresses, i.e., a, /a, b, /b, to thereby generate as the delay internal bank addresses, i.e., c, /c, d, /d.

In detail, the compress controlling block 300 includes a read controlling block 320 and a strobe signal generating block 340. The read controlling block 320 includes a plurality of read controllers, each controlled by a read activation signal RDen for receiving the read bank operating signal and outputting the bank inactivation signal, e.g., Xedb_ba to the data compress block 400; and the strobe signal generating block 340 includes a plurality of strobe signal generators, each for generating a plurality of strobe signals, e.g., iostb.

Herein, each read controller, each strobe signal generator and each DQ output buffer are respectively corresponded to each bank included in the conventional semiconductor memory device. In addition, each buffer, each latch and each router in the internal bank address generator 100 are respectively corresponded to each bit of the bank address.

Hereinafter, there is described a test operation of the semiconductor memory device when the compress test signal tpara is activated.

First, the internal bank address generator 100 activates the plurality of internal bank addresses, i.e., a, /a, b, /b, c, /c, d, /d, in response to the compress test signal tpara and the bank interleaving test signal iocomp without a regard of the bank address. Then, the plurality of read bank operating signals rd_bank0, rd_bank1, rd_bank2 and rd_bank3 outputted from the read decoding block 200 and the plurality of write bank operating signals wt_bank0, wt_bank1, wt_bank2 and wt_bank3 outputted from the write decoding block 500 are activated. If the write activation signal WTen is activated, the write controlling block 600 and the writing driving block 700 are activated and, then, data are inputted to the cell arrays 800. Otherwise, if the read activation signal RDen is activated in response to the additive latency signal AL0 and the bank interleaving test signal iocomp, a plurality of data LI00<0:15> to LI03<0:15> outputted from the cell arrays 800 included in selected bank is compressed and the test result signal is outputted. At this time, other banks, i.e., not selected banks, outputs a logic high level signal instead of the test result signal in response to the bank inactivation signal, e.g., Xedb_ba.

Herein, if a logic state of signal outputted throughout the data pad is a logic high level, the semiconductor memory device has no defective cell; but, otherwise, the semiconductor memory device has at least one defective cell.

Figure 7:
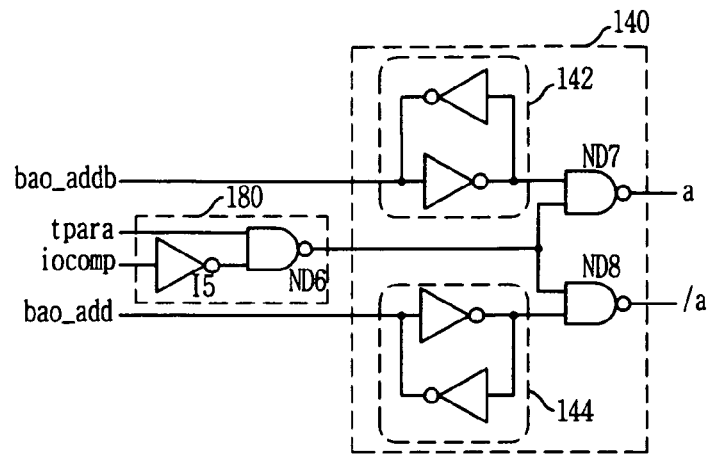
FIG. 7 is a schematic circuit diagram describing a latch included in a latching block shown in FIG. 6.

FIG. 7 is a schematic circuit diagram describing the latch 140 and the latch controller 180 included in a latching block shown in FIG. 6.

As shown, the latch controller 180 includes a fifth inverter I5 and a sixth NAND gate ND6; and the latch 140 includes a first latch unit 142, a second latch unit 144, a first NAND gate ND1 and a second NAND gate ND2. Herein, the first and second latch units 142 and 144 are constituted with two circularly connected inverters.

In the latch controller 180, the fifth inverter I5 is for inverting the bank interleaving test signal iocomp. The sixth NAND gate receives an output signal from the fifth inverter I5 and the compress test signal tpara to thereby generate a result signal of the NAND operation.

The first latch unit 142 is for latching an inverse internal bank address, e.g., ba0_addb; and the second latch unit 144 is for latching an internal bank address, e.g., ba0_add. The first NAND gate ND1 receives an output signal from the latch controller 180 and an inverse state of the inverse internal bank address, i.e., the internal bank address, and an inverse compress test signal to generate a result signal of the NAND operation as a first internal bank address a. Also, the second NAND gate ND2 receives the output signal from the latch controller 180 and an inverse compress test signal to generate a result signal of the NAND operation as a first bar internal bank address /a.

Figure 8:
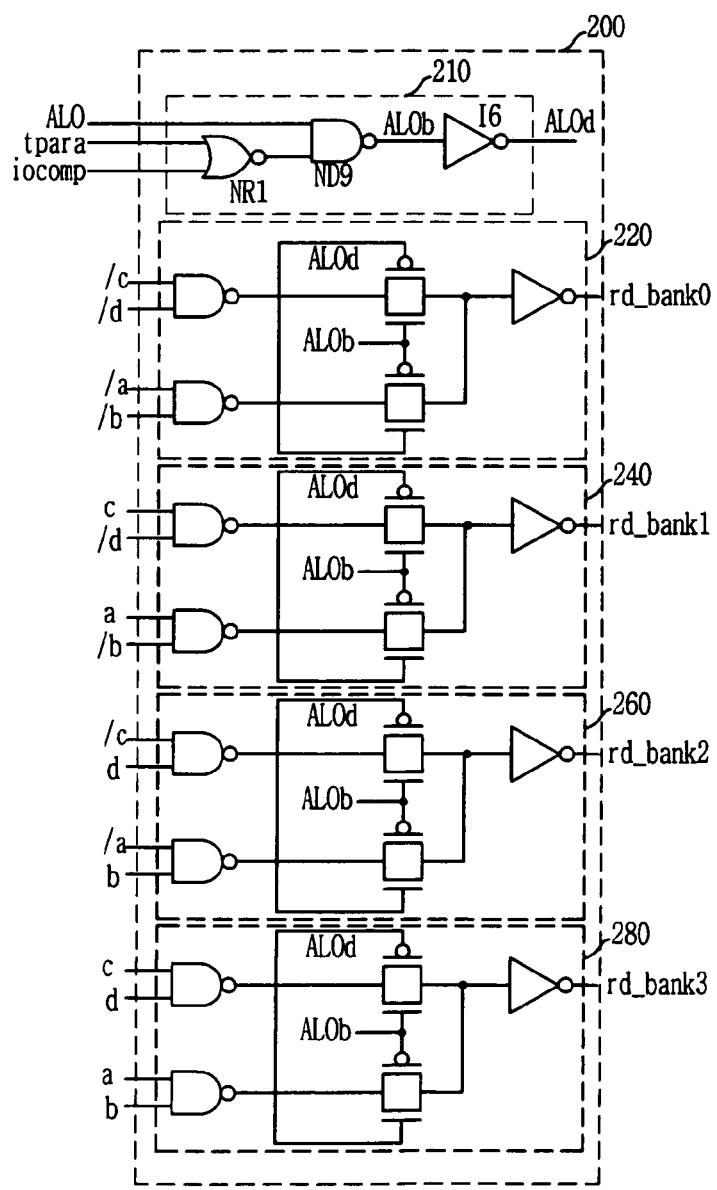
FIG. 8 is a schematic circuit diagram describing the router included in a routing block shown in FIG. 6.

FIG. 8 is a schematic circuit diagram describing the router included in a routing block shown in FIG. 6.

As shown, the read decoding block 200 includes a control signal generator 210 and a plurality of decoders 220, 240, 260 and 280. The control signal generator 21 is for generating first and second control signals, e.g., AL0b and AL0d, in response to the additive latency signal AL0, the compress test signal tpara and the bank interleaving test signal iocomp.

Figure 4:
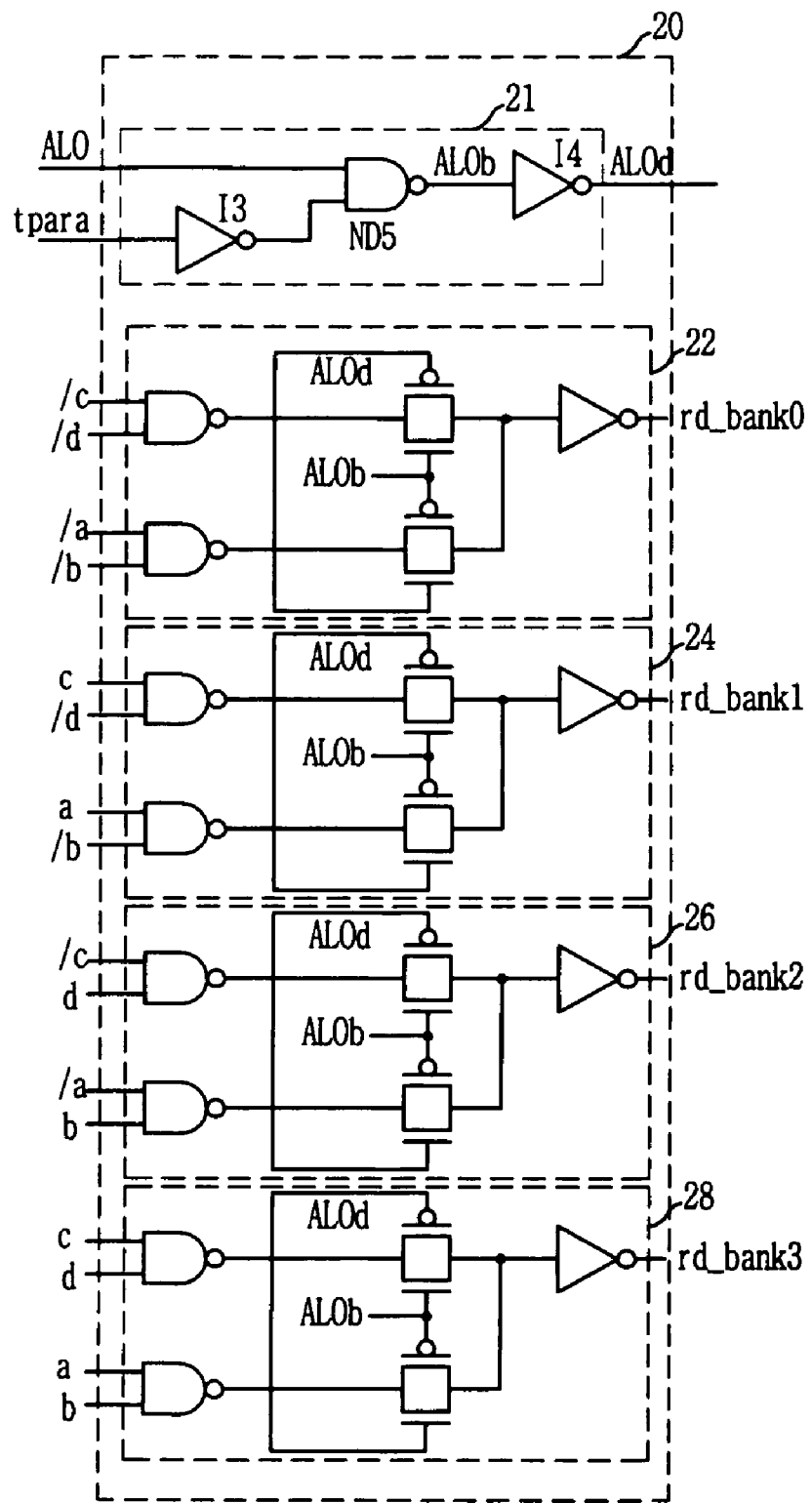
FIG. 4 is a schematic circuit diagram describing a read decoding block shown in FIG. 1.
Figure 5:
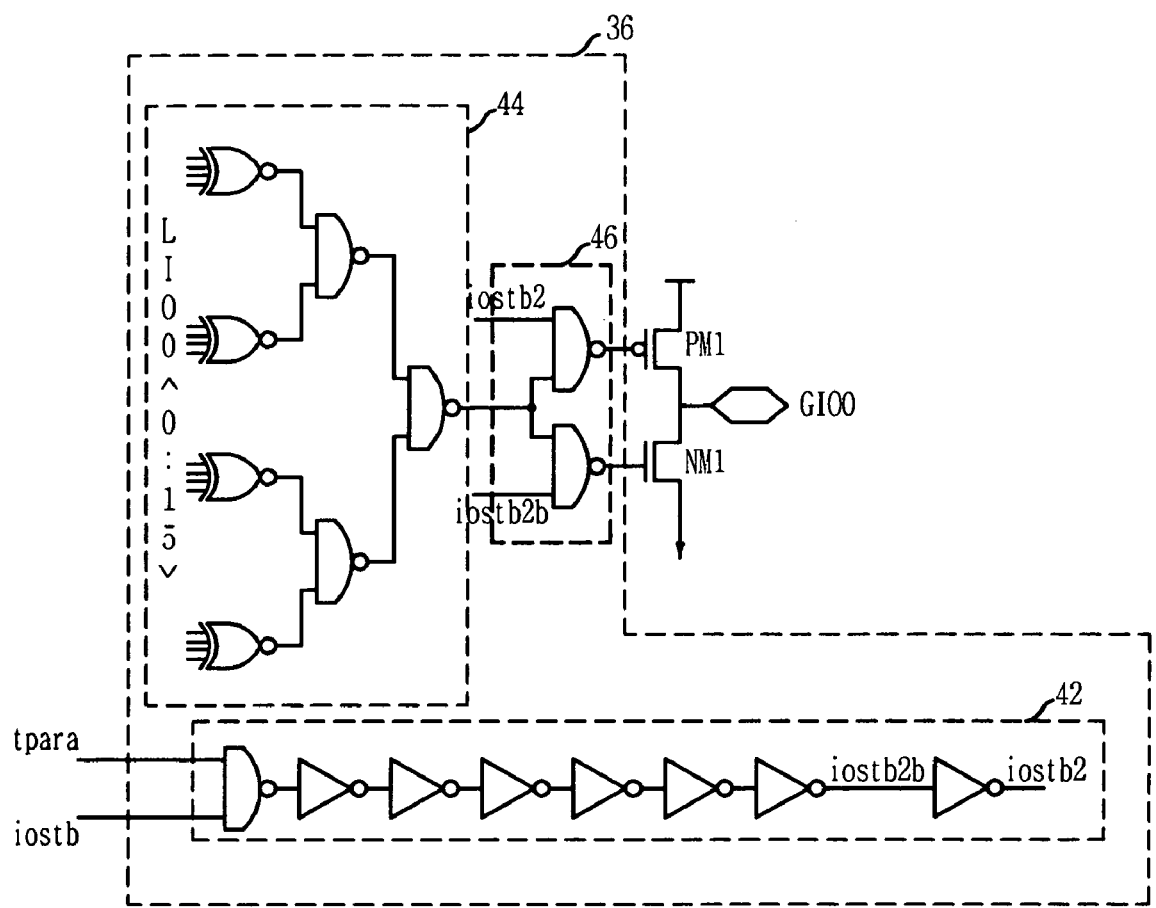
FIG. 5 is a schematic circuit diagram describing a DQ output buffer included in a data compress block shown in FIG. 1.

Each decoder receives two internal bank addresses and selects one of the two internal bank addresses in response to the first and second control signals, e.g., AL0b and AL0d, to thereby generate an inverse selected address as the read bank operation signal. Herein, each decoder is the same to each conventional decoder shown in FIG. 4 in their structures and, thus, detailed operation about each decoder is omitted.

In detail, the control signal generator 210 includes a first NOR gate NR1 for performing the NOR operation of the compress test signal tpara and the bank interleaving test signal iocomp, a ninth NAND gate ND9 for generating a result signal of the NAND operation of the additive latency signal AL0 and an output signal of the first NOR gate NR1 and a sixth inverter I6 for inverting a first control signal AL0b, i.e., an outputted signal from the ninth NAND gate ND9, to thereby generate a second control signal AL0d.

Figure 1:
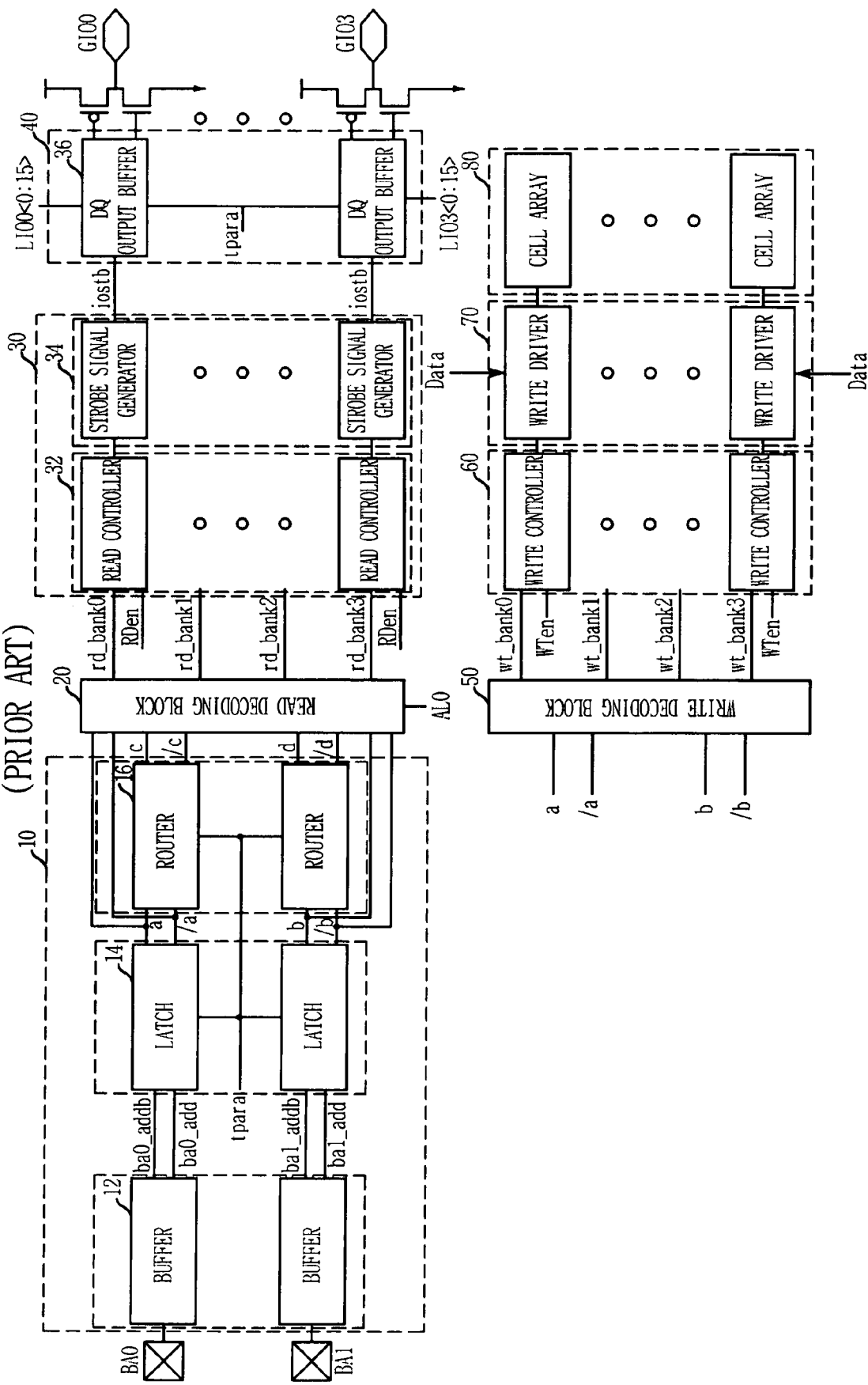
FIG. 1 is a block diagram showing a test block used in a conventional semiconductor memory device.
Figure 2:
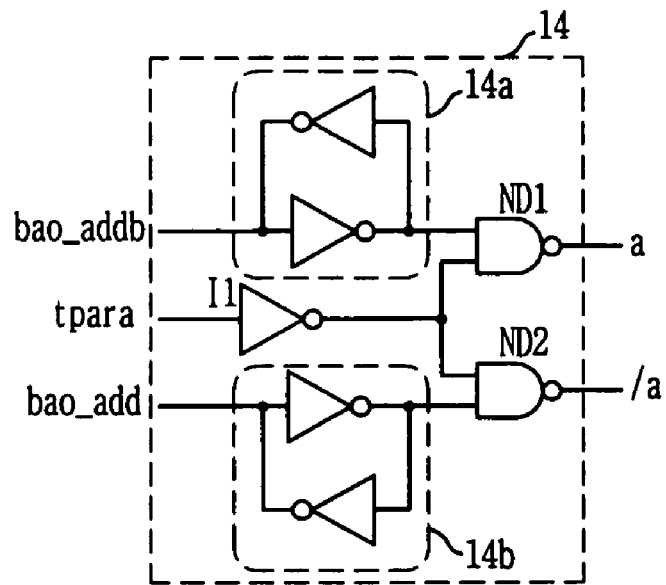
FIG. 2 is a schematic circuit diagram describing a latch included in a latching block shown in FIG. 1.
Figure 3:
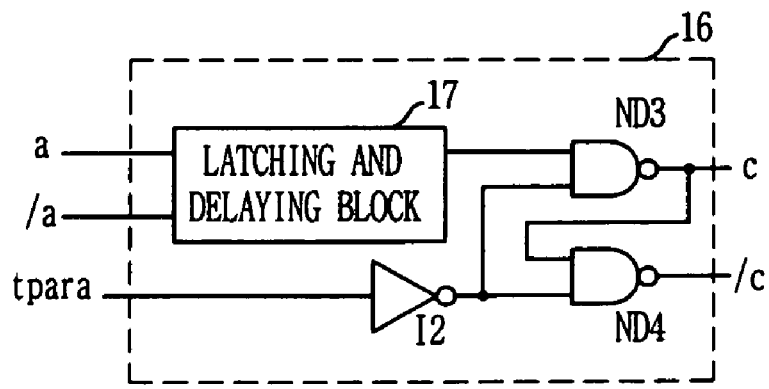
FIG. 3 is a schematic circuit diagram describing a router included in a routing block shown in FIG. 1.
Figure 9:
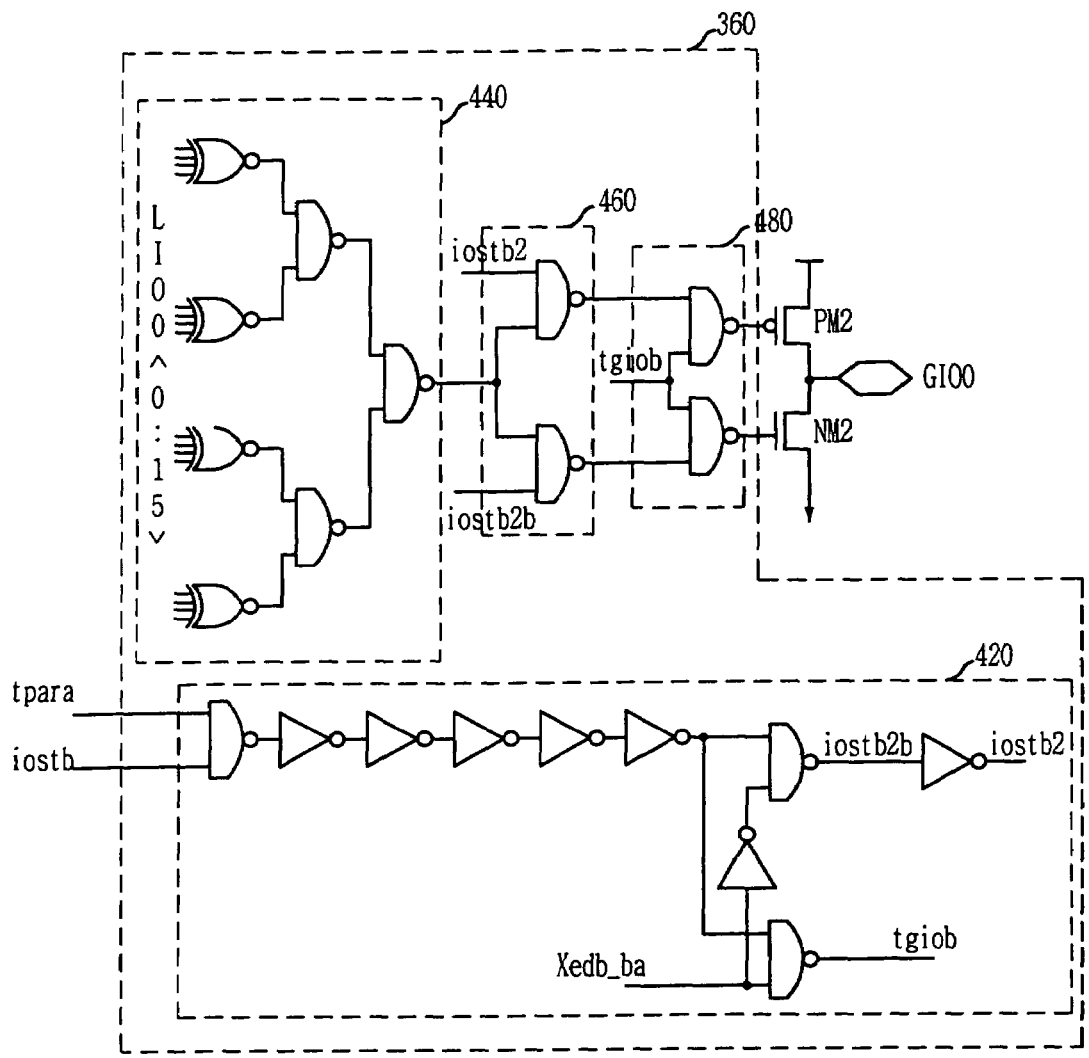
FIG. 9 is a schematic circuit diagram describing a DQ output buffer included in a data compress block shown in FIG. 1.

FIG. 9 is a schematic circuit diagram describing the DQ output buffer included in the data compress block 400 shown in FIG. 1.

As shown, the DQ output buffer, e.g., 360, included in data compress block 400 includes a strobe control generator 420, a comparison block 440, a strobe driving block 460 and an output controller 480. Furthermore, there is shown a GIO driver including two MOS transistors PM2 and NM2 serially coupled between a supply voltage and a ground.

The strobe control generator 420 receives the compress test signal tpara and the bank inactivation signal Xedb_ba and the strobe signal iostb outputted from the strobe signal generator included in signal generating block 340 to thereby generate an output control signal tgiob, a first and a second data strobe signals iostb2 and iostb2b. The comparison block 440 receives each of data LI00<0:15> to LI03<0:15> outputted from the cell arrays 80 in order to compress the 16-bit data as the test result signal. Also, the strobe driving block 460 outputs a compressed data outputted from the comparison block 440 to the GIO driver in response to the first and the second data strobe signals iostb2 and iostb2b. Lastly, the output controller 480 includes two NAND gates for selectively outputting one of the test result signal and a logic high level signal in response to the output control signal tgiob.

Herein, if the bank inactivation signal, e.g., Xedb_ba, is activated, the corresponding bank should output a logic high level signal. It is because a bank outputs a logic low level signal if the bank has at least one defective cell. If one of non-selected banks outputs a logic low level signal, it is impossible to find out a fault in the selected bank.

Figure 10:
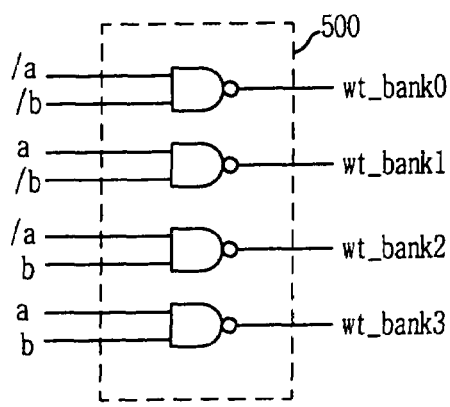
FIG. 10 is a schematic circuit diagram showing a write decoding block shown in FIG. 6.

FIG. 10 is a schematic circuit diagram showing the write decoding block 500 shown in FIG. 6.

As shown, the write decoding block 500 includes four NAND gates, each for receiving non-delay internal bank addresses to thereby generate the write bank operating signal, e.g., wt_bank0. Herein, the write decoding block 500 receives only non-delay internal bank addresses because a latency for the write operation is generally shorter one clock cycle than that for the read operation of the semiconductor memory device.

As above described, the test block can test a bank interleaving mode of the semiconductor memory device by using the compress test mode. In addition, the semiconductor memory device can test all of unit cells so fast by using the compress test mode.

Herein, though the test uses internal bank addresses controlled by the additive latency in the present invention, the test can be performed without a regard of the additive latency.

Therefore, for testing an operation of the semiconductor memory device in the bank interleaving mode, the compress test mode can be carried out and, as a result, a required time for testing is dramatically reduced.

The present application contains subject matter related to Korean patent applications No. 2004-18919 and No. 2004-01824, respectively filed in the Korean Patent Office on Mar. 19, 2004 and on Jan. 10, 2004, the entire contents of which being incorporated herein by references.

While the present invention has been described with respect to the particular embodiments, it will be apparent to those skilled in the art that various changes and modifications may be made without departing from the spirit and scope of the invention as defined in the following claims.

What is claimed is:

1. A method for testing an operation of a semiconductor memory device having a plurality of banks in a compress test mode, the method comprising the steps of:
    testing the semiconductor memory device by simultaneously activating the plurality of banks;
    testing the semiconductor memory device by selectively activating the plurality of banks; and
    delaying a bank address, which is used for activating each bank, in order to test an operation of a semiconductor memory device based on an additive latency,
    wherein, in the compress test mode, one of the testing steps is selected by a bank interleaving test signal.

2. The method as recited in claim 1, wherein each bank includes one data pad for inputting and outputting data.

3. The method as recited in claim 2, wherein the step of testing the semiconductor memory device by selectively activating the plurality of banks includes the step of supplying normal state information to data pads, each corresponding to each of inactivated banks except for activated bank, for preventing the inactivated banks from being considered as a defective bank.

4. A method for testing an operation of a semiconductor memory device having a plurality of banks in a compress test mode, the method comprising the steps of:
    receiving an external bank address and generating internal bank addresses based on the external bank address in response to a compress test signal and a bank interleaving test signal;
    receiving the internal bank addresses and testing a read operation of at least one bank selected by the internal bank addresses in response to an additive latency signal, the compress test signal and the bank interleaving test signal; and
    receiving the internal bank addresses and testing a write operation of the selected banks,
    wherein, in the compress test mode, the plurality of banks are simultaneously activated or selectively activated in response to the bank interleaving test signal.

5. The method as recited in claim 4, wherein the internal bank addresses are classified into non-delay internal bank addresses and delay internal bank addresses.

6. The method as recited in claim 5, wherein the step of receiving an external bank address and generating internal bank addresses includes the steps of:
    receiving the compress test signal and the bank interleaving test signal and controlling a latch control signal;
    converting the external bank address into the internal bank addresses;
    latching the internal addresses to thereby output the internal addresses as the non-delay internal bank addresses; and
    delaying the non-delay internal bank addresses to thereby generate the delay internal bank addresses.

7. The method as recited in claim 5, wherein the step of receiving the internal bank addresses and testing a read operation of at least one bank includes the steps of:
    decoding one of the non-delay internal bank addresses and the delay internal bank addresses based on the additive latency signal, the compress test signal and the bank interleaving test signal to thereby generate a plurality of read bank operating signals;
    receiving the plurality of read bank operation signals and generating a plurality of strobe signals; and
    compressing a plurality of data outputted from cell arrays in the selected banks and generating a test result signal in response to the compress test signal and the plurality of strobe signals.

8. The method as recited in claim 5, wherein the step of receiving the internal bank addresses and testing a write operation of the selected banks includes the steps of:
    decoding the non-delay internal bank addresses to thereby generate a plurality of write bank operating signals;
    receiving the plurality of write bank operating signals and generating a plurality of write driving signals; and
    storing inputted data in cell arrays in the selected banks in response to the plurality of write driving signals.

* * * * *